United States Patent [19]
Chen et al.

[11] Patent Number: 5,747,383
[45] Date of Patent: May 5, 1998

[54] METHOD FOR FORMING CONDUCTIVE LINES AND STACKED VIAS

[75] Inventors: Li-Chun Chen; Chih-Heng Shen, both of Hsin-chu, Taiwan

[73] Assignee: Taiwan Semiconductor Manufacturing Company Ltd, Hsin-Chu, Taiwan

[21] Appl. No.: 523,329

[22] Filed: Sep. 5, 1995

[51] Int. Cl.[6] .................................................. H01L 21/441
[52] U.S. Cl. ........................ 438/648; 438/656; 438/672; 438/720
[58] Field of Search ....................... 437/187, 192, 437/288 CON, 245, 235; 148/DIG. 43, DIG. 51, DIG. 106; 156/652.1, 653.1; 438/648, 637, 656, 672, 675, 720

[56] References Cited

U.S. PATENT DOCUMENTS

| | | | |
|---|---|---|---|
| 4,398,338 | 8/1983 | Tickle et al. | |
| 4,592,802 | 6/1986 | Deleonibus et al. | 156/644 |
| 5,010,039 | 4/1991 | Ku et al. | 437/228 |
| 5,024,722 | 6/1991 | Cathey, Jr. | 156/643.1 |
| 5,231,051 | 7/1993 | Baldi et al. | 437/187 |
| 5,286,344 | 2/1994 | Blalock et al. | 156/657.1 |
| 5,286,677 | 2/1994 | Wu | 437/195 |
| 5,407,698 | 4/1995 | Emesh | 427/99 |

*Primary Examiner*—Caridad Everhart
*Attorney, Agent, or Firm*—George O. Saile; Stephen B. Ackerman

[57] ABSTRACT

A method for fabricating an improved connection between active device regions in silicon, to overlying metallization levels, has been developed. A LPCVD tungsten contact plug process, which results in optimum coplanarity between the top surface of the tungsten plug and the surrounding insulator surface, has been created.

19 Claims, 4 Drawing Sheets

METHOD FOR FORMING CONDUCTIVE LINES AND STACKED VIAS

BACKGROUND OF THE INVENTION

(1) FIELD OF THE INVENTION

This invention relates to the fabrication of semiconductor components, and more particularly to the formation of multilayer conducting patterns on components such as semiconductor or dielectric substrates. More specifically, the invention is directed to the formation of coplanar conductor/insulator films on components such as integrated circuits or dielectric substrates employed in the fabrication and packaging of semiconductor components.

Due to shrinkage in size of semiconductor components and increased circuit density the need arises to obtain contracts having surfaces of very small area and spaced at very small intervals. Furthermore, the complexity of interconnecting the many components in the dense circuits requires multiple layers of interconnecting conductor lines. In addition, this complexity requires that many contacts be extended through multiple layers of insulator material causing the need to stack contacts or vias. In order to achieve such stacking without the detrimental effects of voids in the conductive material above the contact or poor step coverage of the subsequent conducting layer due to non-planar topography above the contact, it is necessary that the contact material be coplanar with the insulator layer.

(2) DESCRIPTION OF RELATED ART

U.S. Pat. No. 4,592,802 entitled "Method of Fabrication of Aluminum Contacts Through a Thick Insulating Layer In an Integrated Circuit" granted Jun. 3, 1986 to Simon Deleonibus et al relates to forming a filled via or contact. Briefly, the method of this invention comprises, after deposition of an insulating layer, in etching narrow contact openings and in depositing by chemical vapor deposition a conductive material such as doped polysilicon. The method then comprises in removing the conductive material outside the narrow contact openings by uniform vertical anisotropic etching to a depth corresponding to the thickness deposited over the entire surface of the insulating layer outside the narrow openings so as to remove the conductive material outside said openings while removing only a small proportion of said material within the openings.

In this prior art method the coplanarity of the insulator/conductor-filled-via or contact is degraded due to the necessity to overetch when removing the conductive material outside the narrow contact openings. Overetching is necessary to compensate for the non-uniformities of the various fabrication steps, including the thickness non-uniformity of the conductive material deposition process, the non-uniformity of the etching of the conductive material during the main etch step, and the non-uniformity of the etching of the conductive material during an overetch step. As a practical matter in a manufacturing process, overetch is required to insure that all conductive material is removed at all locations on the insulating substrate, where the localized time for removal will depend on the conductive material deposition thickness uniformity, the conductive material main etching uniformity, the overetching uniformity, and enhanced etching along the growth seam at the center of contacts filled by a chemical vapor deposition film growth process. Typically the overetch must overcome about 10% non-uniformity of conductor deposition, 10% non-uniformity of the main etching, and 10% non-uniformity of the overetch. In a worst case situation, this necessitates a 30% overetch, which degrades the coplanarity at many contact sites. Furthermore, the overetch causes the formation of a cavity at the center of contacts, due to enhancement of the rate of etching along the growth seam after the growth seam is exposed during the main etch step; the size and severity of the cavity formation depending on the degree of overetch. Such a cavity further degrades the coplanarity of insulator/conductor contact and compounds the problem of achieving reliable electrical contacts.

SUMMARY OF THE INVENTION

One object of the present invention is to provide an improved and new process for forming planar insulator/metal structures.

Another object of the present invention is to provide a new and improved process for the fabrication of semiconductor devices having an interconnection metallurgy or conductor pattern embedded in an insulating layer with coplanar top surfaces.

Furthermore, it is an object of the present invention to provide a new and improved method for forming coplanar conductive contact material/insulator at the sites of small area contacts in semiconductor devices and multiple level interconnection conductor patterns.

The method in accordance with the invention comprises, after etching narrow contact openings in an insulating layer, in depositing by chemical vapor deposition a conductive material (especially tungsten) of sufficent thickness Lo ensure that the entire volume of the narrow contact openings is filled. The method then comprises in removing the conductive material outside the narrow contact openings by vertical etching to a depth corresponding substantially to the nominal thickness deposited over the entire surface of the insulator layer, but without overetch. This method causes removal of a substantial portion (but not all at every location on the insulating substrate) of the conductive naterial outside the narrow contact openings while removing only a small portion of said material within said openings. The method then comprises formation of a protective mask at each contact site; followed by additional vertical anisotropic etching means to remove all residual conductive material outside the protected contact sites; and removal of the protective mask. This protective mask is the reverse or negative image of the mask used to define the etched contact holes. The protective mask material may be photoresist, which is patterned by standard photolithographic image reversal procedures or magnesium oxide or silicon oxide formed by lift-off.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of forming semiconductor devices, with the tungsten contact plug process, will now be described in detail. This tungsten contact plug can be used as part of MOSFET devices that are currently being manufactured in industry; therefore only the specific areas unique to understanding this invention will be described in detail.

Figure 1:
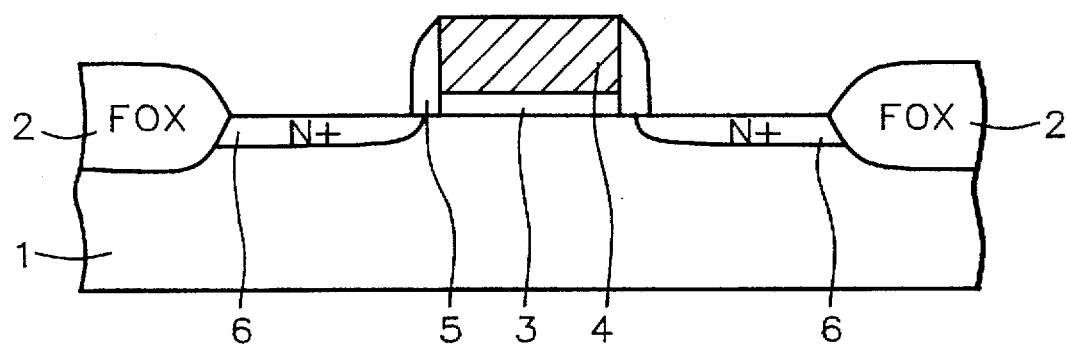
FIG. 1, which schematically, in cross-sectional representation, illustrates a specific metal oxide semiconductor field effect transistor, (MOSFET), device, prior to the start of the tungsten plug fabrication sequence.

FIG. 1 shows a typical NFET, (N-type Field Effect Transistor), device. Formation of contacts to the device elements will be described using the tungsten contact plug process. A substrate, 1, composed of P-type, single crystal silicon with a <100> orientation, is used. A thick field oxide region, 2, (FOX), is formed surrounding the region where the device is to be built. Briefly the method used to form the FOX region is to use a thin thermal oxide, and a silicon nitride layer, as an oxidation mask. The desired FOX insulator area is etched in the silicon nitride/silicon dioxide mask using conventional photolithographic techniques and dry etching processes. After removal of the masking photoresist, and a wet chemical cleanup, a field oxide is grown, typically to a thickness between about 4000 to 6000 Angstroms. After removal of the oxidation mask using a hot phosphoric acid solution, followed by a buffered hydrofluoric acid dip process to remove the thin silicon dioxide layer, a gate oxide, 3, is grown at a temperature between about 850° to 950° C., to a thickness between about 70 to 250 Angstroms. Next a polysilicon layer is deposited using LPCVD, (Low Pressure Chemical Vapor Deposition), at a temperature between about 550° to 700° C., to a thickness between about 2000 to 4000 Angstroms. An ion implantation procedure, using phosphorous, at an energy between about 50 to 100 Kev., at a dose between about $1 \times 10^{13}$ to $5 \times 10^{14}$ atoms/cm$^2$, is used to dope the underlying polysilicon layer. Standard photolithographic procedures and reactive ion etching, (RIE), using SF$_6$ as an etchant, are next employed to create the polysilicon gate structure, 4, shown in FIG. 1. Another LPCVD process, using tetraethylorthsilicate as a source material, is used at a temperature between about 500° to 700° C., to deposit silicon oxide, to a thickness between about 2000 to 4000 Angstroms. Anisotropic, selective RIE, (Reactive Ion Etching), using CF$_4$ and H$_2$, is then used to create the oxide sidewall spacer 5. The source and drain regions, 6, are next formed using ion implantation of arsenic, at an energy between about 50 to 100 Kev., at a dose between about $1 \times 10^{14}$ to $1 \times 10^{15}$ atoms/cm$^2$.

Figure 2:
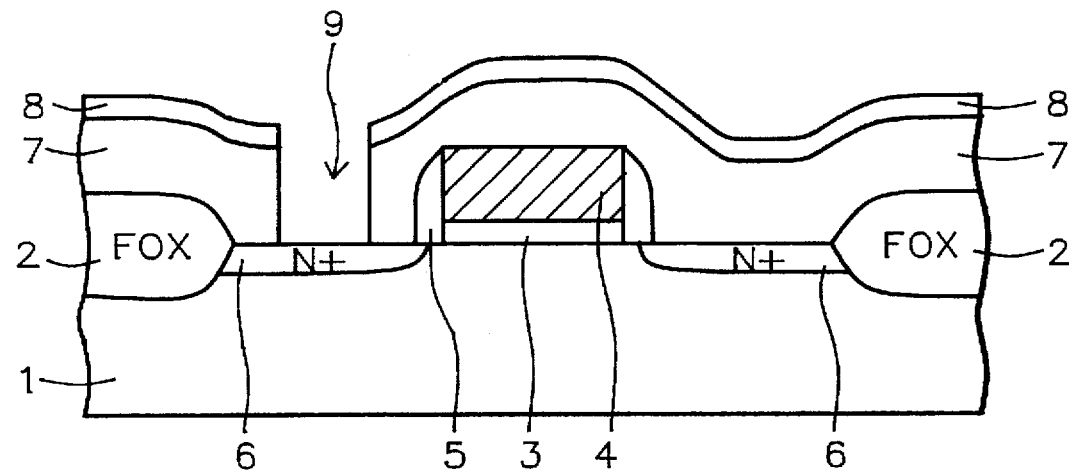
FIGS. 2–6, which in cross-sectional representation illustrate the process sequence used to fabricate the tungsten plug.

A silicon oxide layer, 7, is deposited using, LPCVD or APCVD, (Atmospheric Pressure Chemical Vapor Deposition), at, a temperature between about 400° to 800° C., to a thickness between about 6000 to 12000 Angstroms, followed by LPCVD deposition of silicon nitride, 8, deposited at a temperature between about 600° to 800° C., to a thickness between about 500 to 3000 Angstroms, using NH$_3$ and SiH$_4$, at a pressure between about 300 to 400 mTorr. Conventional photolithographic procedures are used to expose a region of the silicon nitride/silicon oxide dielectrics. A RIE procedure is then used to open the contact hole to the active device region in the substrate, using Cl$_2$, for the silicon nitride, 8, while CF$_4$/CHF$_3$ are used to open the contact hole in the oxide layer, 7. Photoresist removal and subsequent wet chemical cleanup using a solution of 10 parts ammonium fluoride to 1 part hydrofluoric acid in a water solution, at a temperature between about 20° to 25° C., for a time between about 10 to 60 sec. result in contact hole, 9, shown in FIG. 2.

Figure 3:
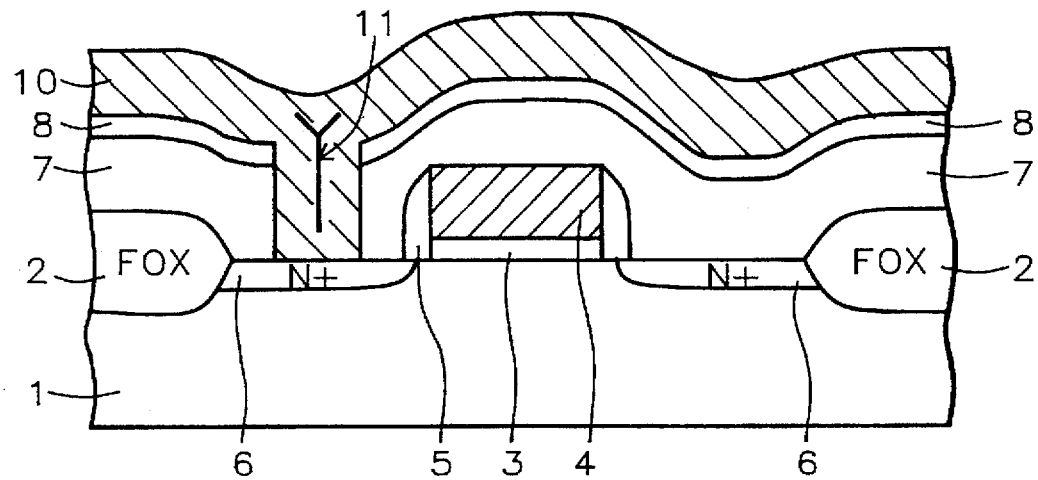

Deposition of tungsten, 10, is next performed, as shown in FIG. 3. This LPCVD process is carried out using WF$_4$, at a flow betweem about 50 to 150 sccm, at a temperature between about 400° to 500° C., to a thickness between about 5000 to 8000 Angstroms. It is critical to deposit a tungsten layer, which is thick enough to completely fill contact hole, 9. The LPCVD process is effective in this regard because in this proceess the tungsten film growth occurs on both the vertical and horizontal insulator surfaces. Therefore, filling of a narrow contact hole is achieved when the deposited tungsten thickness on a horizontal surface is slightly greater than one/half the contact width. Due to the growth of the tungsten film in both the horizontal and vertical directions a growth seam, 11, is embedded within the filled contact as shown in FIG. 3.

Figure 4:
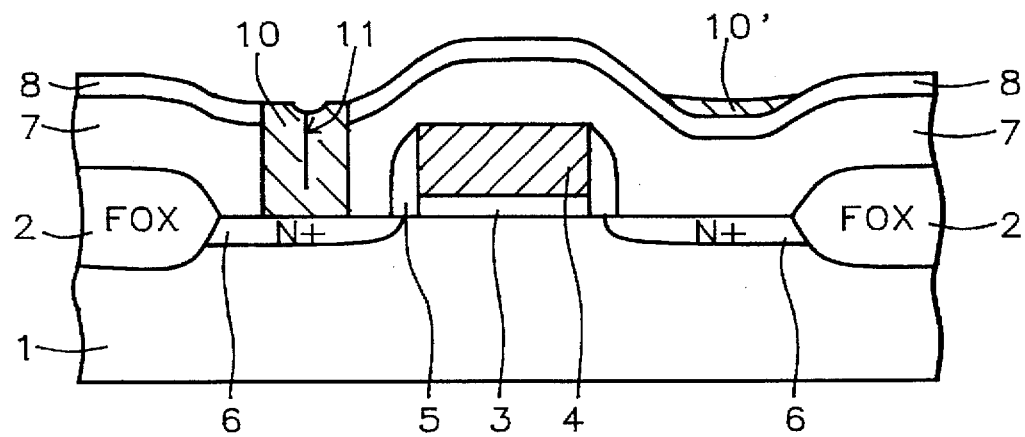

The next process step is to etch the tungsten layer by vertical anisotropic etching to a depth corresponding substantially to the nominal thickness deposited over the entire surface of the insulating layer, but without overetching. This etching step is performed using SF$_6$ at an ambient pressure between about 300 to 400 mTorr. This method causes removal of a substantial portion (but not all at every location on the insulating substrate; see, for example at 10') of the tungsten layer outside the narrow contact openings while removing only a small portion of the tungsten within the contact openings, as shown in FIG. 4.

Figure 5:
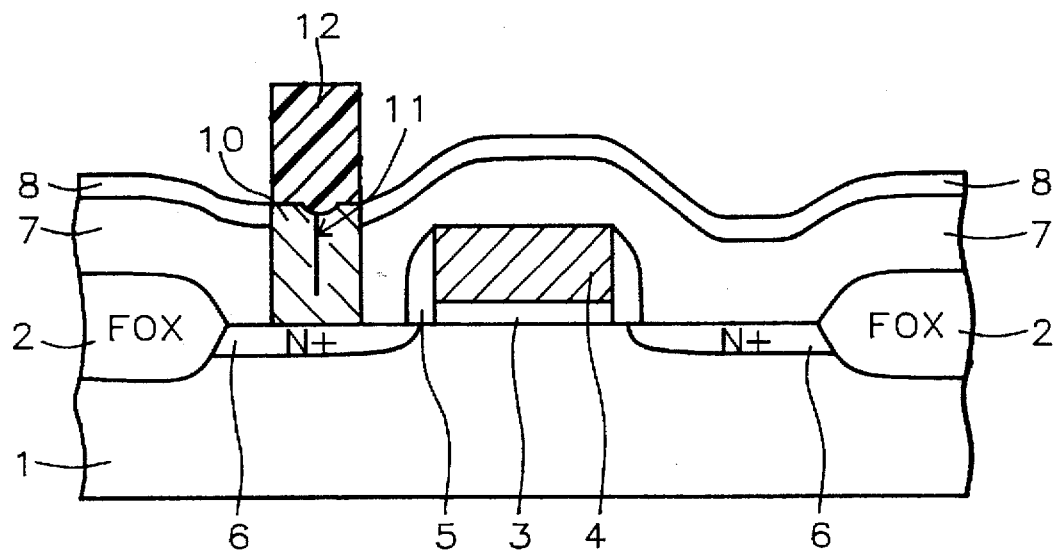

A protective photoresist mask, 12, which has the reverse or negative image of the contact opening mask pattern is next formed by conventional photolithographic procedures. Conventional photolithographic image reversal of the contact hole photoresist etch mask may be used. Alternately, a hard protective mask such as magnesium oxide or silicon oxide may be formed by deposition through the openings of a thin lift-off mask, which is susequently removed. This lift-off mask has the same image as the mask used to etch the contact holes. Since lift-off produces an image reversal, this alternate process also produces a protective mask at each contact opening site. Formation of the protective mask is followed by additional etching of the residual tungsten layer by vertical anisotropic etching to insure complete removal of the tungsten layer outside the narrow contact openings. This etching step is performed using an SF$_6$ at an ambient pressure between about 300 to 400 mTorr. By protecting the tungsten surface above the contact opening region further etching of the tungsten is prevented and the ideal coplanarity of the tungsten and insulator is preserved. This step is shown in FIG. 5.

Figure 6:
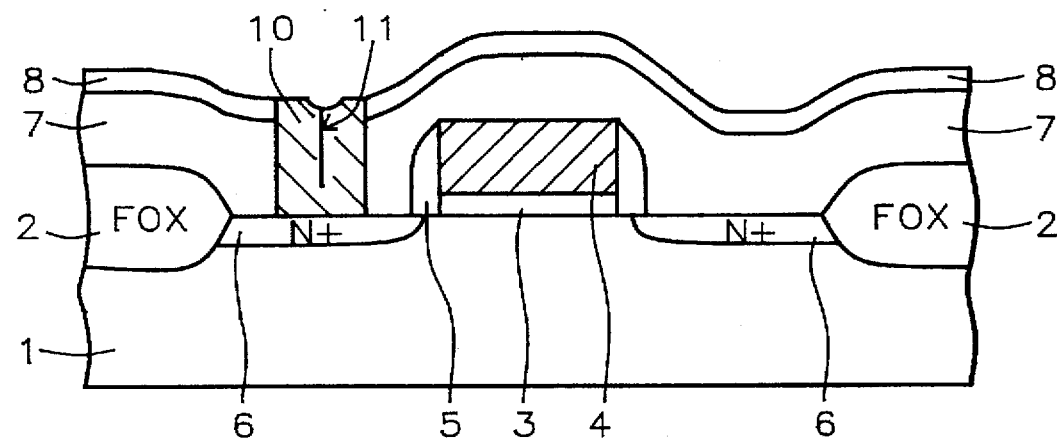

The protective photoresist mask pattern is then removed by conventional dry ashing procedures or wet chemical dip etching or a combination of these two processes. The resulting coplanar tungsten/insulator contact is shown in FIG. 6.

Figure 7:
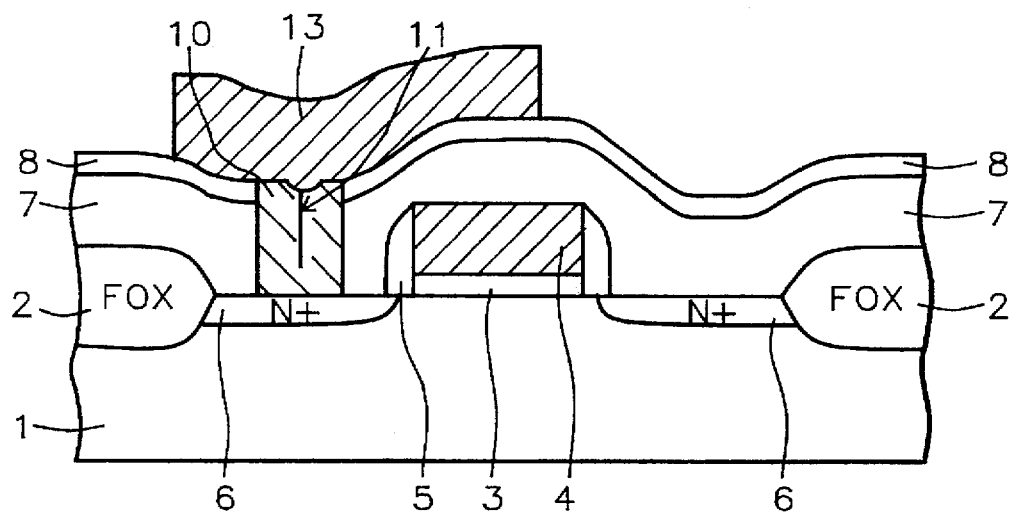
FIG. 7, which in cross-sectional representation illustrates a metallized MOSFET device, fabricated using the tungsten contact plug process.

FIG. 7 illustrates an interconnect metallization, used in conjunction with the tungsten contact plug structure. A metallization, in the form of Al-Cu, is deposited to a thickness between about 6000 to 12000 Angstroms. Standard photolithographic and RIE processing, using a Cl$_2$/BCl$_3$ etchant, are used to form metal structure, 13, which allows contact to the underlying N$^+$ region, 6, through the tungsten contact plug, 10.

This process, an improved tungsten plug contact, although shown as part of a NFET, MOS device, can be used as well in PFET devices. In addition, complimentary, CMOS, as well as BiCMOS devices can be fabricated using this invention.

Figure 8:
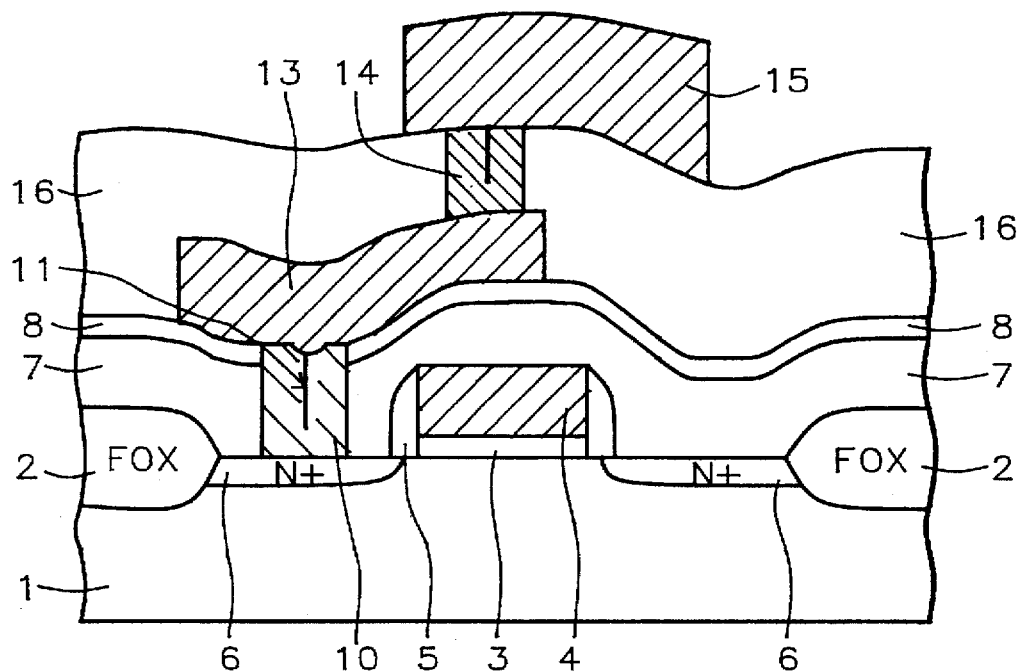
FIG. 8, which in cross-sectional representation illustrates a metallized MOSFET device, fabricated using the tungsten plug process to connect two levels of metal interconnect patterns.

Also, contacts between successive conductive pattern layers can be fabricated using this invention, as shown in cross-sectional representation in FIG. 8. As represented, tungsten plug, 14, connects first-level metallization, 13, to second-level metallization, 15, through insulating layer, 16.

While the invention has been particularly shown and described with reference to the preferred embodiments thereof, it will be understood by those skilled in the art that various changes in form and details may be made without departing from the spirit and scope of the invention.

What is claimed is:

1. A method of fabrication of an interconnection layer in an integrated circuit comprising:

depositing a conducting material layer on an insulating layer and into contact openings formed at the sites where it is desired to make electrical contact to the underlying circuit element;

etching of said conducting material layer by vertical etching to said insulating layer while leaving in some regions remaining conductive material layer, but without overetching said conductive material layer into said contact openings;

forming at said contact opening sites, a protective mask layer, consisting of magnesium oxide or silicon oxide, having the reverse image of the mask used to etch said contact openings;

additional etching of said conducting material layer by vertical etching to remove said remaining conductive material layer; and removing said protective mask layer, consisting of magnesium oxide or silicon oxide.

2. A method of fabrication according to claim 1, wherein the said conductive material layer is tungsten deposited by LPCVD processing, at a temperature between about 400° to 500° C., to a thickness between about 5000 to 8000 Angstroms, using $WF_6$ at a flow between about 50 to 150 sccm.

3. A method of fabrication according to claim 2, wherein the etching of said tungsten conductive material layer is performed using $SF_6$ at an ambient pressure between about 300 to 400 mTorr.

4. A method of fabrication according to claim 1, wherein said magnesium oxide or silicon oxide protective mask is formed by lift-off.

5. A method for fabricating a MOSFET device on a semiconductor substrate, using a conductive plug to provide electrical contact between an active device region in the substrate, and the interconnect metallization, comprising the steps of:

providing said active device element in said semiconductor substrate;

depositing a first dielectric layer on said semiconductor substrate, that includes said active device element;

depositing a second dielectric layer on said first dielectric layer, to form composite dielectric layer;

photolithographic processing to open a region in photoresist, exposing said composite dielectric layer, directly overlying said active device element;

anisotropic removal of said composite dielectric layer, in said exposed region in photoresist, to create a contact hole to said active device region;

cleaning surface of said active device region, in said contact hole opening;

depositing a conductive material layer on said active device region, in said contact hole, and on said second dielectric layer;

etching of said conducting material layer by vertical etching to said second dielectric layer while leaving in some regions remaining conductive material layer, but without overetching said conductive material layer into said contact hole;

forming at said contact hole sites, a protective mask layer, consisting of magnesium oxide or silicon oxide, having the reverse image of the mask used to etch said contact hole;

additional etching of said conducting material layer by vertical etching to remove said remaining conductive material layer; and removing said protective mask layer, consisting of magnesium oxide or silicon oxide.

6. The method of claim 5, wherein said active device region in said semiconductor substrate, is an N-type doped region.

7. The method of claim 5, wherein said first dielectric layer is silicon oxide, deposited using LPCVD processing, at a temperature between about 400° to 800° C., to a thickness between about 6000 to 12000 Angstroms.

8. The method of claim 5, wherein said second dielectric layer is silicon nitride, deposited using LPCVD processing, at a temperature between about 600° to 800° C., to a thickness between about 500 to 3000 Angstroms.

9. The method of claim 5, wherein said contact hole is created using anisotropic RIE removal of said composite dielectric, in $Cl_2$, for said second dielectric layer, and $CF_4/CHF_3$/argon, for said first dielectric layer.

10. The method of claim 5, wherein said conductive material layer is tungsten, deposited using LPCVD processing, at a temperature between about 400° to 500° C., to a thickness between about 5000 to 8000 Angstroms, using $WF_6$ at a flow between about 50 to 150 sccm.

11. The method of claim 10, wherein etching of said tungsten conductive material layer is performed using $SF_6$ at an ambient pressure between about 300 to 400 mTorr.

12. A method of fabrication of an interconnection layer in an integrated circuit comprising:

depositing an insulating layer over a metallization pattern;

photolithographic processing to open a region in photoresist, exposing said insulating layer, directly overlying an element of said metallization pattern;

anisotropic removal of said insulating layer, in said exposed region in photoresist, to create a contact hole to said metallization pattern;

depositing a tungsten conductive layer on said insulating layer, and into said contact holes, making contact to the underlying said metallization pattern;

etching of said tungsten conductive layer by vertical etching to said insulating layer while leaving in some regions remaining tungsten conductive layer, but without overetching said tungsten conductive layer into said contact holes;

forming a protective mask layer, consisting of magnesium oxide or silicon oxide, having the reverse image of the mask used to etch said contact holes into said insulating layer;

additional etching of said tungsten conductive layer by vertical etching to remove said remaining tungsten conductive layer; and removing said protective mask layer, consisting of magnesium oxide or silicon oxide.

13. A method of fabrication according to claim 12, wherein the said insulating layer is silicon oxide, deposited using APCVD processing, to a thickness between about 5000 to 15000 Angstroms.

14. A method of fabrication according to claim 12, wherein said contact hole is created using anisotropic RIE removal of said insulating layer in $CF_4/CHF_3$/argon.

15. A method of fabrication according to claim 12, wherein said tungsten conductive layer is deposited using LPCVD processing, at a temperature between about 400° to 500° C., to a thickness between about 5000 to 8000 Angstroms, using $WF_6$ at a flow between about 50 to 150 sccm.

16. A method of fabrication according to claim 12, wherein etching of said tungsten conductive layer is performed using $SF_6$ at an ambient pressure between about 300 to 400 mTorr.

17. A method of fabrication according to claim 12, wherein said additional etching of said tungsten conductive layer is performed using $SF_6$ at an ambient pressure between about 300 to 400 mTorr.

18. A method of fabrication according to claim 5, wherein said magnesium oxide or silicon oxide protective mask is formed by lift-off.

19. A method of fabrication according to claim 12, wherein said magnesium oxide or silicon oxide protective mask is formed by lift-off.

* * * * *